(12) United States Patent
Bakkers et al.

(10) Patent No.: US 7,700,934 B2
(45) Date of Patent: Apr. 20, 2010

(54) ELECTRIC DEVICE WITH NANOWIRES COMPRISING A PHASE CHANGE MATERIAL

(75) Inventors: Erik Petrus Antonius Maria Bakkers, Eindhoven (NL); Martijn Henri Richard Lankhorst, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/575,585

(22) PCT Filed: Aug. 19, 2005

(86) PCT No.: PCT/IB2005/052729

§ 371 (c)(1),
(2), (4) Date: Mar. 20, 2007

(87) PCT Pub. No.: WO2006/035325

PCT Pub. Date: Apr. 6, 2006

(65) Prior Publication Data

US 2007/0257246 A1 Nov. 8, 2007

(30) Foreign Application Priority Data

Sep. 27, 2004 (EP) .................................. 04104687

(51) Int. Cl.
*H01L 29/12* (2006.01)
(52) U.S. Cl. ................ 257/2; 977/762; 438/102; 438/95
(58) Field of Classification Search ............... 257/2–5, 257/16, 49–63, 646, 650, 529, 530, 278, 257/E27.004, E45.002, E31.029; 365/163; 438/95, 100, 128, 258, 238, 386, 570, 102, 438/103; 977/762
See application file for complete search history.

(56) References Cited

U.S. PATENT DOCUMENTS

| | | | |
|---|---|---|---|
| 5,858,862 A * | 1/1999 | Westwater et al. .......... 438/503 |
| 5,879,955 A | 3/1999 | Gonzalez et al. |
| 5,933,365 A | 8/1999 | Klersy et al. |
| 6,605,535 B1 * | 8/2003 | Lee et al. .................... 438/684 |
| 7,012,273 B2 * | 3/2006 | Chen ............................. 257/4 |

(Continued)

FOREIGN PATENT DOCUMENTS

CN 1547268 11/2004

(Continued)

OTHER PUBLICATIONS

Shihai Kan, Taleb Mokari, Eli Rothenberg & Uri Banin "Synthesis and size-dependent properties of zinc-blende semiconductor quantum rods" Nature Materials 2, 2003 pp. 155-158.*

(Continued)

*Primary Examiner*—David Vu
*Assistant Examiner*—Suberr Chi (57) ABSTRACT

A method of manufacturing an electric device including providing a body with a resistor of a phase change material being changeable between a first phase and a second phase, the resistor having a first electrical resistance when the phase change material is in the first phase, and a second electrical resistance different from the first electrical resistance when the phase change material is in the second phase. The method further includes connecting the resistor between first and second conductors.

6 Claims, 9 Drawing Sheets

U.S. PATENT DOCUMENTS

| | | |
|---|---|---|
| 2004/0037106 A1* | 2/2004 | Lu et al. .................... 365/96 |
| 2004/0052117 A1 | 3/2004 | Jiang |
| 2006/0034116 A1* | 2/2006 | Lam et al. ................... 365/151 |

FOREIGN PATENT DOCUMENTS

| | | | |
|---|---|---|---|
| EP | 1274092 A2 | | 1/2003 |
| WO | 03083949 | | 10/2003 |
| WO | 2004057684 | | 7/2004 |
| WO | WO 2004/057618 | * | 7/2004 |

OTHER PUBLICATIONS

H. Y. Peng, N. Wang, W. S. Shi, Y. F. Zhang, C. S. Lee, and S. T. Lee "Bulk-quantity Si nanosphere chains prepared from semi-infinite length Si nanowires" J. Appl. Phy. 89, No. 1, Jan. 1, 2001, pp. 727-731.*

I. Enculescu et al, "Metal Chalcogenide Semiconductor Nanowires", Feb. 2005, Chalcogenide Letters, vol. 2, No. 2, pp. 9-15.*

Alfredo Morales et al; "A Laser Ablation Method for the Synthesis of Crystalline Semiconductor Nanowires", Science, vol. 279, pp. 208-211, 1998.

Hideyuki Tanaka et al; "Electrical Switching Phenomena in a Phase Change Material in Contact With Metallic Nanowires", Jpn. J. Appl Phys, vol. 4, pp. LI443-L1445, Part 2, No. 12B, Dec. 15, 2002.

X. Duan et al; "General Synthesis of Compound Semiconductor Nanowires", Advance Materials, vol. 12, No. 4. 2000.

Haring Bolivar P et al; "Lateral Design for Phase Change Random Access Memory Cells With Low-Current Consumption", E*PCOS 04 Symposium, Balzers Leichtenstein, Sep. 4, 2004, XP002353347.

K. Hiruma et al; "Growth and Optical Properties of Nanometer-Scale GaAs and InAs Whiskers", Applied Physics Review, Journ. Appl. Phys. vol. 77, No. 2, Jan. 15, 1995.

M.T. Bjork et al; "One-Dimensional Heterostructures in Semiconductor Nanowhiskers", Applied Physics Letters, vol. 80, No. 6 pp. 1058-1062, Feb. 11, 2002.

M. S. Gudiksen et al; "Growth of Nanowire Superlattice Structures for Nanoscale Photonics and Electronics" Nature, vol. 415, pp. 617-620, Feb. 7, 2002.

S. De Franceschi et al; "Single-Electron Tunneling in InP Nanowires", Applied Physics Letter, vol. 83, No. 2, pp. 344-346, Jul. 14, 2003.

* cited by examiner

ELECTRIC DEVICE WITH NANOWIRES COMPRISING A PHASE CHANGE MATERIAL

The invention relates to a method of manufacturing an electric device having a body with a resistor comprising a phase change material being changeable between a first phase and a second phase, the resistor electrically connecting a first conductor and a second conductor. The resistor may have a first electrical resistance when the phase change material is in the first phase, and a second electrical resistance different from the first electrical resistance when the phase change material is in the second phase.

The invention further relates to such an electric device.

Figure 1:
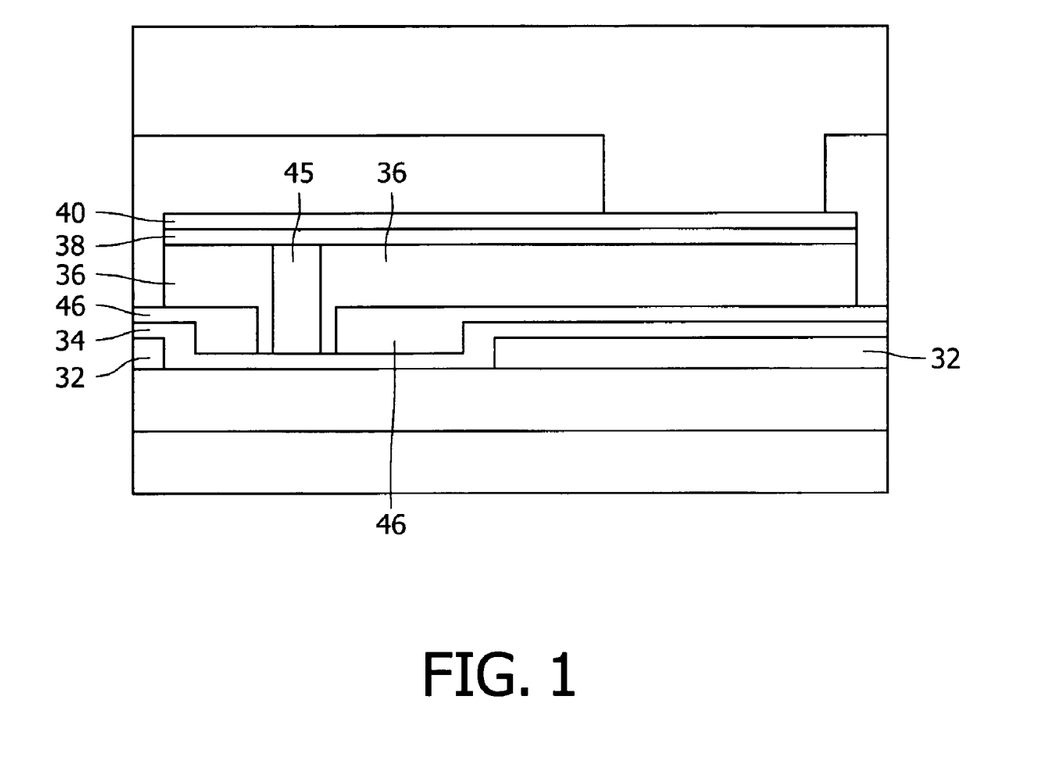
FIG. 1 is a cross section of the known electric device.

U.S. Pat. No. 5,933,365 discloses a method in which a substrate is provided with an electric contact layer 32 and an electrically conductive heating layer 34, both shown in FIG. 1A. On top of these layers a pore 46 is formed into a dielectric layer thereby exposing the heating layer 34. The dielectric layer and pore are then provided with a layer 36 of memory material which is a GeSbTe phase change material that has an amorphous state with a relatively high electrical resistance and a crystalline state with a relatively low electrical resistance. The upper surface of the layer 36 of the phase change material is then provided with an electrically conductive heating layer 38 and an electric contact layer 40.

The portion of the layer of memory material inside the pore 46 can undergo a phase transition from the amorphous state to the crystalline state, and back. This phase transition can be induced by an electrical current flowing from electric contact layer 32 and the electrically conductive heating layer 34 through the portion of the layer of memory material inside the pore 46 to the electrically conductive heating layer 38 and the electric contact layer 40. In this way the electrical resistance of the layer 36 of the memory material is switchable between a relatively high value and a relatively low value.

It is a disadvantage of the known method of manufacturing that the energy required for switching between the amorphous state and the crystalline state, referred to as the switching energy, is relatively high. This switching energy scales with the volume of the memory material undergoing the phase transition. In the known electric device the volume is determined by the size of the pore 46. In standard manufacturing methods the size of the pore 46 is determined by the minimum feature size obtainable by lithography. The known electrical device may optionally comprise a thermal plug 45 encapsulated by layer 36 of the memory material to further reduce the switching energy. In standard manufacturing methods the size of the thermal plug 45 is determined by the minimum feature size obtainable by lithography.

It is an object of the invention to provide an electric device with a relatively low switching energy.

According to the invention the resistor comprising the phase change material is a nanowire that is provided to a first conductor thereby electrically connecting the nanowire and the first conductor. The nanowire is provided with a second conductor thereby electrically connecting the nanowire and the second conductor. In this way an electric circuit is obtained which allows for establishing the electrical resistance of the resistor.

In the electric device thus obtained the volume undergoing the phase transition, and thus the switching energy, is determined by the diameter of the nanowire which may be about 2 nm or larger, such as e.g. 5 nm or larger, such as 7 nm or larger, such as 10 nm or larger, such as 15 nm or larger, such as 25 nm or larger, such as 50 nm or 100 nm. The volume undergoing the phase transition is relatively small and thus the switching energy is relatively low.

Nanowires may be obtained by self-assembling as is described e.g. in the article "Growth and optical properties of nanometer-scale GaAs and InAs whiskers" by K. Hiruma et al., Journal of Applied Physics, volume 77, issue 2, page 447-457, 1995 and in the article "A Laser Ablation Method for the Synthesis of Crystalline Semiconductor Nanowires" by A. Morales and C. Lieber, Science, volume 279, page 208-211, 1998. In this way a nanowire may be obtained by a process which is independent of lithography and which allows for wire diameters well below lithographic resolution. Due to the self-assembling the dimensions of the nanowire are well controlled and may be well below the minimum feature size achievable by lithography.

The nanowire may be solid. Alternatively, the nanowire may have a hollow portion or may be entirely hollow. Such a nanowire is often referred to in the art as a nanotube.

The nanowires may be obtained by a method that does not involve any material removal treatment such as etching. This may have the advantage that process fluctuations due to a material removal treatment are avoided.

The nanowire may have a length in a longitudinal direction perpendicular to the wire diameter of e.g. 20 nm or more such as 50 nm or more.

The step of providing the first conductor with the nanowire may comprise the steps of:

providing the first conductor with a dielectric layer having an aperture by which a part of the first conductor is exposed, and providing the part of the first conductor exposed by the aperture with the nanowire.

By providing the nanowire to an aperture in a dielectric layer which aperture exposes the first conductor, the nanowire may be positioned in a well-defined position. In this way the position may be defined on a scale determined by the resolution of the lithography used whereas the volume of the phase change material, and hence the switching energy, is determined by the wire diameter which may be significantly smaller than the resolution of the lithography used. This embodiment is particularly useful when the first conductor is obtained by an, e.g. lithographic, process having a dimension similar to that of the aperture. The aperture may be obtained in a similar way as a contact hole commonly used in so-called back-end processing.

In an embodiment the nanowire is provided to the aperture by the steps of:

providing the part of the first conductor exposed by the aperture with a metal particle, and growing the nanowire by means of a vapor-liquid-solid (VLS) growth method using the metal particle as a catalyst.

This way of providing the nanowire of the aperture has the advantage that it is relatively easy to electrically connect the nanowire to the first conductor. Moreover, only the metal particle has to be provided to the aperture instead of the nanowire itself. This renders the method relatively easy. In addition, the diameter of the nanowire is substantially identical to the size of the metal particle from which the nanowire is grown. Thus by using a metal particle of a well-defined size, which is readily available, the wire diameter may be controlled. The metal particle may have a diameter between 2 and 100 nm, preferably between 5 and 50 nm. The wire diameter may be tuned in the same range with a dispersion of approximately 10%.

The aperture may have a depth of 5-100 nm, preferably 5-20 nm, in a direction parallel to a main axis of the nanowire.

Such a relatively shallow aperture allows for a relatively reliable growth of the nanowire inside the aperture.

In an alternative embodiment of the method according to the invention the nanowire may be grown elsewhere by means of the VLS method, e.g. on a different substrate. Subsequently, it may be detached from this substrate and may be dispersed in a solvent, e.g. by ultrasonification. The nanowire may then be placed horizontally on an, e.g. insulating, substrate. Contacts may be evaporated on top of the nanowire at its respective two outer portions. The nanowire volume undergoing the phase change is then equal to the volume of the nanowire between the contacts.

The nanowire may be obtained by other methods than the VLS method, e.g. by providing a porous matrix the pores of which may be filled by a material comprising the phase change material thereby obtaining the nanowire comprising the phase change material. A method of producing the nanowires may comprise the steps of depositing a porous material such as e.g. anodized aluminum oxide, having a thickness of 100 nm up to several microns. The pore sizes may be tuned from e.g. 10 to 200 nm. The pore separation may be about twice the pore diameter. The density depends on the pore size and may be as high as $10^{10}$ cm$^{-2}$ and subsequently filling the pores electrochemically with a material comprising the phase change material. This method has the advantage that it may be applied to phase change materials which may be difficult to grow by means of the VLS method. The porous material may be part of the electric device, i.e. the nanowires manufactured in the pores remain at the position where they are fabricated. Alternatively, the nanowires may be detached from the porous matrix, e.g. by dissolving the matrix, and may be may be dispersed in a solvent which may be used as described in the previous paragraph.

When a metal particle is used as a catalyst the metal particle may be provided by providing a layer of the metal to the aperture, and subsequently heating the layer of the metal thereby forming the metal particle. This is a convenient way to bring a metal particle inside the aperture, in particular when the electric device comprises a large number of apertures each of which is to be provided with at least one metal particle. Alternatively, a liquid solution comprising one or more metal particles may be cast on the dielectric layer and the aperture, the solution may be dried, leaving at least one metal particle in each aperture.

The phase change material comprised in the nanowire may comprise $(In_{1-x}Ga_x)_ySb_{1-y}$ with $0 \leq x \leq 1$ and $0 \leq y \leq 1$. These materials have good properties of a switchable resistor such as a relatively large difference between the first electrical resistance and the second electrical resistance, which renders the read-out of the resistance value of the resistor relatively stable, in particular when used as a memory device. In addition these materials require a relatively low voltage to induce a phase transition from a phase with a relatively poor electrical conductivity to a phase with a relatively good electrical conductivity.

Preferably, $y \leq 0.5$ holds as such nanowires may be grown conveniently by the VLS method. Nanowires with $y < 0.5$ may be obtained by first growing nanowires with $y = 0.5$ and subsequently heating the nanowires to a temperature sufficiently high such that some of the Sb atoms are evaporated. Reducing the Sb concentration relative to the concentration of In and Ga increases the crystallization speed of the phase change material which allows for a relatively fast phase transition from an amorphous phase to a crystalline phase.

In an embodiment the ratio of Ga, In and Sb in the phase change material may be represented by an area in ternary composition diagram Ga—In—Sb in atomic percentages, said area being of quadrangular shape having the following vertices T, U, V and W where T is $Ga_{46}Sb_{54}$, U is $Ga_{10}In_{36}Sb_{54}$, V is $Ga_{26}In_{36}Sb_{38}$, and W is $Ga_{62}Sb_{38}$. In such phase change materials the stability of amorphous phase is 10 year or more at 30 degree C. and the crystallization time smaller than 30 ns.

During the step of growing the nanowire by means of a VLS growth method the temperature of the growing nanowire may be decreased, e.g. by 10 to 80 degrees C. Due to the decreased temperature the portion of the nanowire grown under this condition has a reduced wire diameter compared to the portion of the nanowire grown at the higher temperature. As a result, a relatively small active volume of phase change material is defined to which volume the phase change may be confined, thereby reducing the switching energy required. Preferably, the nanowire segment with the reduced wire diameter is grown at a temperature of 450 degrees C. or less, such as e.g. 420 degrees C. The portion of the nanowire grown at a relatively high temperature has a relatively large wire diameter which allows for an efficient conduction of an electric current to the active volume.

Alternatively, or in addition, the portion may be grown at a temperature which is so high that the fusion of the reactants from the gas phase in the metal particle becomes rate limiting for the growth.

The temperature may be decreased after a certain period during which the growth took place at a first value to a second value. Alternatively, the temperature may be decreased in several steps or continuously.

The electric device according to the invention has a body with a resistor comprising a phase change material being changeable between a first phase and a second phase, the resistor having a first electrical resistance when the phase change material is in the first phase, and a second electrical resistance different from the first electrical resistance when the phase change material is in the second phase, the resistor being a nanowire electrically connecting a first conductor and a second conductor. Such an electric device is an electrical switchable resistor which may serve as a memory element in which information is stored by means of a resistance value. Using a nanowire as the resistor has the advantage that the active volume undergoing the phase change may be kept relatively small, resulting in a relatively low switching energy.

The invention is not restricted to two discrete values of the electrical resistance. Instead, the phase change material may have several phases or may be composed of a mixture of the two phases, and the resistor may have a corresponding range of different resistance values which it may acquire.

In an embodiment of the electric device, the nanowire comprises a segment which comprises the phase change material and has a wire diameter, and a further segment with a further wire diameter which is larger than the wire diameter of the segment. As the segment comprising the phase change material has a wire diameter which is smaller than the wire diameter of the further segment, the current density is relatively high is the segment comprising the phase change material. Due to the relatively high current density the Joule heating is relatively effective in the segment where the phase change is to be induced whereas it is relatively low in the further segment where no phase change is to be induced. The Joule heating in the further segment contributes relatively little to inducing the phase change and therefore it is relatively ineffective. Reducing the relative amount of Joule heating in the further segment with respect to that in the segment comprising the phase change material increases the overall efficiency of the electric device in inducing the phase change.

The nanowire may comprise an additional segment with an additional wire diameter which is larger than the wire diameter of the segment, the segment being located between the further segment and the additional segment. In such an electric device both the path of the electric current to the segment undergoing the phase transition and away from the segment undergoing the phase transition is relatively low Ohmic, resulting in relatively small losses.

Alternatively, or in addition, the segment which comprises the phase change material may be hollow and the further segment may be solid whereby the cross section of the current path in the segment is smaller than the cross section of the current path in the further segment.

The segment comprising the phase change material and undergoing the phase transition, and the further segment and/or the additional segment may be of different chemical composition. Preferably, the further segment and/or the additional segment is composed of a material which has an electrical conductivity which is better than that of the phase change material in both the first phase and the second phase. The different chemical composition may be due to different doping concentrations and/or due to different dopants.

In an embodiment the segment, the additional segment, and preferably the further segment each comprise the phase change material. In such an electric device the active volume undergoing the phase transition is at the current conducting interfaces in contact only with the phase change material which reduces any chemical interaction between the phase change material undergoing the phase transition, and the adjacent segments of the nanowire, which increases the life time, i.e. the number of phase transitions reliably achievable, of the electric device.

The segment of the nanowire comprising the phase change material may have a wire diameter between 5 and 50 nm which results in a relatively high current density and a relatively low switching energy.

The resistor may constitute a memory element in which information is stored by means of the resistance value of the resistor. The body may comprise an array of memory cells, each memory cell comprising a respective memory element and a respective selection device, and a grid of selection lines, each memory cell being individually accessible via the respective selection lines connected to the respective selection device.

Such an electric device constitutes a memory array in which multiple bits of information may be stored and read.

The selection device may comprise a diode which results in a relatively compact and simple electric device. The diode may be a pn diode, a Zener diode or a punch through diode. The diode may be integral part of the nanowire and may be grown via the VLS growth method by changing the composition of the gas from which the nanowire is grown as described e.g. in the article "Growth of nanowire superstuctures for nanoscale photonics and electronics" by M. S. Gudiksen et al., Nature, volume 415, page 617-620, 2002. Similarly, by changing the main components in the composition of the gas phase, e.g. from In and P to In and As, nanowires containing heterojunctions may be fabricated as is described in the article "One-dimensional heterostructures in semiconductor nanowhiskers" by M. T. Björk et al., Applied Physics Letters, volume 80, page 1058-1062, 2002.

The selection device may comprise a metal oxide semiconductor field effect transistor having a source region, a drain region and a gate region. The grid of selection lines may comprise N first selection lines, M second selection lines, and an output line. The resistor of each memory element may electrically connect a first region selected from the source region and the drain region of the corresponding metal oxide semiconductor field effect transistor to the output line. A second region of the corresponding metal oxide semiconductor field effect transistor selected from the source region and the drain region and being free from the first region, may be electrically connected to one of the N first selection lines. The gate region may be electrically connected to one of the M second selection lines.

Such an electric device is particularly easy to embed in a standard CMOS process for manufacturing MOSFETs.

Alternatively, a bipolar transistor may be used as a selection device. The emitter region and the base regions may be connected to two respective selection lines while the collector is connected to the output line via the nanowire.

These and other aspects of the method and the electric device will be further elucidated and described with reference to the drawings, in which.

An embodiment of the electric device 100, shown in FIGS. 2-6 at various stages of the manufacturing, has a body 102, which comprises a substrate 101 which may comprise, e.g. a single crystal p-doped, silicon semiconductor wafer. The body further comprises an array of selection devices 171. In the embodiment shown in FIGS. 2-6 the electric device 100 has a 3×3 array but the invention is not limited to an array of this size nor to an array of this shape. The body 102 further comprises a grid of selection lines 120, 121 such that each memory cell is individually accessible via the respective selection lines 120, 121 connected to the respective selection device 171.

In the embodiment shown in FIGS. 2-6 the selection device 171 comprises a metal oxide semiconductor field effect transistor (MOSFET), and more specifically an NMOS transistor. The MOSFET has an n-doped source region 172, an n-doped drain region 173, and a gate region 174. The source region 172 and the drain region 173 may comprise more than one portion of n-doped material, such as a lightly doped n-portion and a more heavily doped n+ portion. The n-doped source region 172 and the drain region 173 are separated by a channel region. The gate region 174, formed above the channel region, controls the flow of current from the source region 172 to the drain region 173 through the channel region. The gate region 174 may comprise a layer of polycrystalline silicon. The gate region 174 is separated from the channel region by a gate dielectric layer.

The grid of selection lines 120, 121 comprises N=3 first selection lines 120 and M=3 second selection lines 121, and an output line. Mutually insulated terminal regions which are selected from the source region 172 and the drain region 173 of the corresponding metal oxide semiconductor field effect transistor will be provided later on in the process of manufacturing with nanowires. Further regions of the metal oxide semiconductor field effect transistors selected from the source region 172 and the drain region 173 and being free from the terminal regions are electrically connected to one of the N first selection lines 120. The gate region 174 is electrically connected to one of the M second selection lines 121. In the embodiment shown in FIGS. 2-6 the mutually insulated terminal regions are the source regions 172, and the further regions are the drain regions 173. In another embodiment, not shown, the mutually insulated terminal regions are the drain regions 173, and the further regions are the source regions 172.

In this embodiment the drain regions 173 are connected to the first interconnect layer, also referred to as metal 1, the gate regions 174 are connected to the second interconnect layer, also referred to as metal 2 and the contact hole for the nanowires is connected to the third interconnect layer, also referred to as metal 3, or to a higher interconnect layer. Such relatively deep contact holes in which the nanowires have to be grown may be avoided by connecting the nanowires to metal 1.

The selection lines 120, 121 are connected to line selection devices and row selection devices, respectively, both of which are not shown.

The gate region 174 and the drain region 173 are provided with layers of tungsten silicide and tungsten plugs 122 for electrically connecting the gate region 174 and the drain region 173 to the selection lines 121 and 120, respectively. The selection lines 120 and 121 are formed from a conductive material such as, e.g., aluminum or copper. The array of selection devices 171 and the grid of selection lines 120, 121 are formed using standard IC technology.

Figure 2:
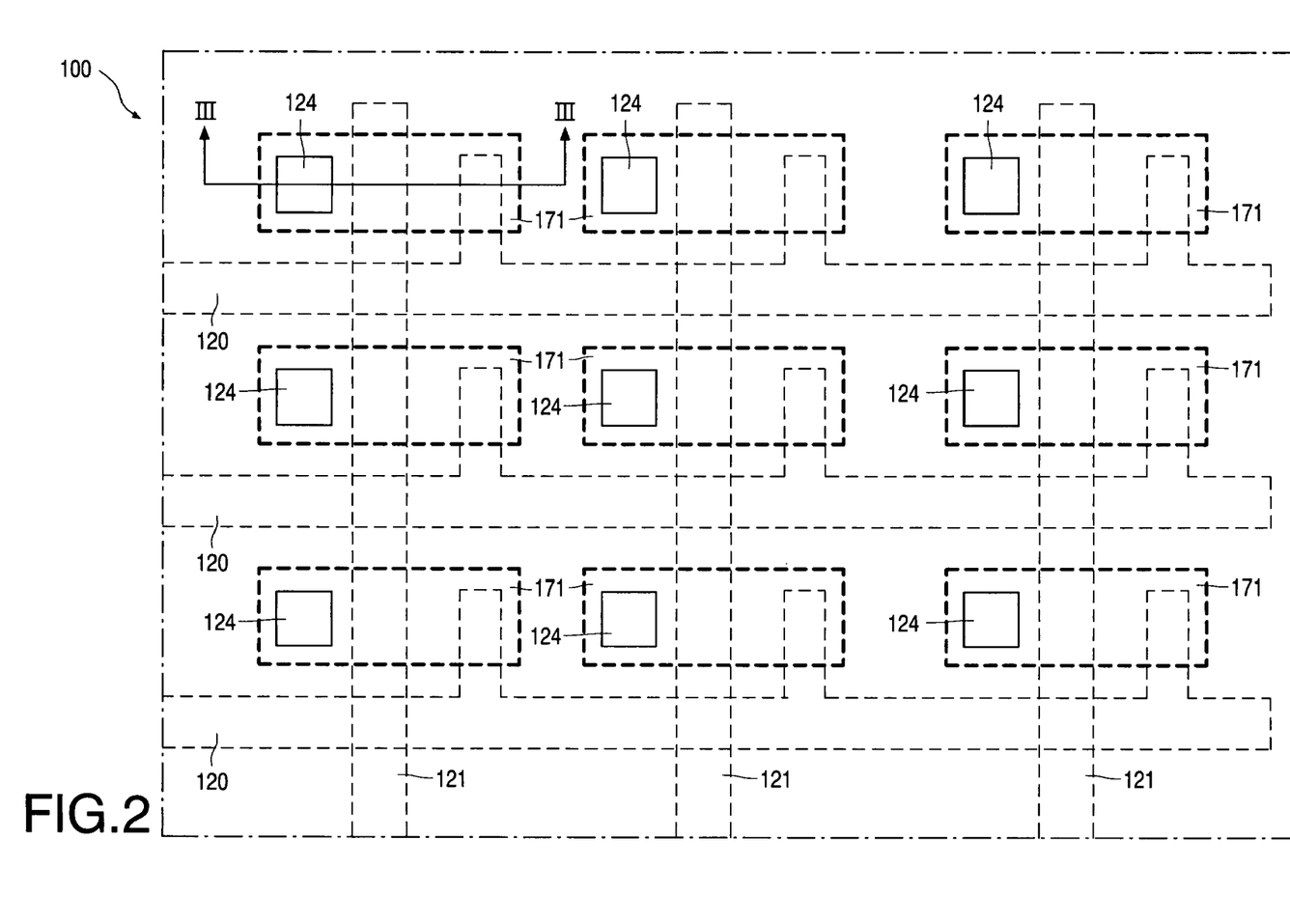
FIG. 2 is a top view of an embodiment of the electric device according to the invention at a first stage of the manufacturing.
Figure 3:
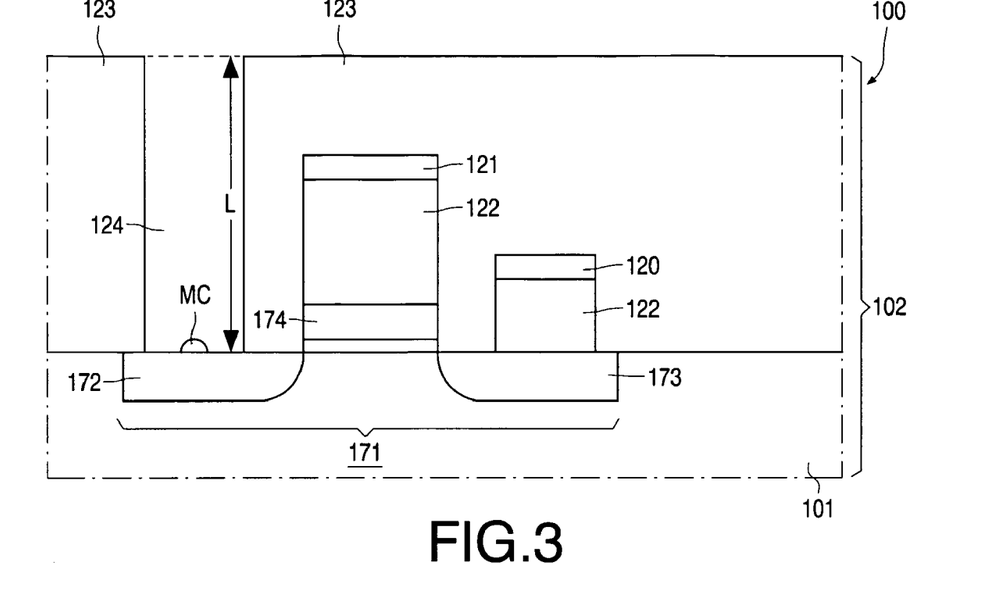
FIG. 3 is a cross section of an embodiment of the pre-fabricated electric device of FIG. 2 along line III-III.

Except for the electric connections described above the selection devices 171 and the selection lines 120, 121 are mutually insulated from each other by and embedded in a dielectric material 123, e.g. silicon dioxide. The dielectric material 123 may be composed of several layers which may include different materials. The surface of the dielectric material 123 may be polished by chemical mechanical polishing (CMP) for obtaining a relatively smooth and relatively plain surface. Subsequently, openings 124 shown in FIGS. 2 and 3 are created in the dielectric material 123 to expose the terminal regions, i.e. in this embodiment the source regions 172.

The structure thus obtained is provided inside the openings 124 with one or more nanowires NW. In an embodiment the nanowires NW are grown by the VLS method which is described in the article "Growth and optical properties of nanometer-scale GaAs and InAs whiskers" by K. Hiruma et al., Journal of Applied Physics, volume 77, issue 2, page 447-457, 1995 and in the article "A Laser Ablation Method for the Synthesis of Crystalline Semiconductor Nanowires" by A. Morales and C. Lieber, Science, volume 279, page 208-211, 1998.

To this end, the structure thus obtained, in particular the opening 124, may be provided with a metal film of e.g. Ni, Co, Fe or Au having typically a thickness of 0.2-5 nm. During an initial heating step one or more, but preferably one, metal particles, in the remainder also referred to as metal clusters MC are formed from the metal film inside the opening 124 on top of the source region 172 as shown in FIG. 3. The metal clusters MC may have a size of 2-100 nm, preferably between 5 and 50 nm. The actual size may depend on the thickness of the metal film, the temperature at which the metal clusters are formed, the metal used, on the material of the barrier layer, if present, and on the size of the aperture 124 which may be 500 nm or less, preferably 250 nm or less such as 180 nm, 130 nm or 90 nm or less. Alternatively, the metal clusters MC may be deposited directly as colloidal metal particles of any of these materials, e.g. from a solution or by means of a focused ion beam. Depositing the metal clusters MC from solution or by means of a focused ion beam has the advantage that their size may be controlled relatively easily and reliably.

In an embodiment a barrier layer is provided to the bottom part of the opening 24 prior to providing the metal cluster MC to protect the front-end from metal contamination. The barrier layer on the sidewalls of the opening 124 may be partially removed, e.g. during the removal of MC to prevent shorts between the layer of memory material and the drain region.

Figure 4:
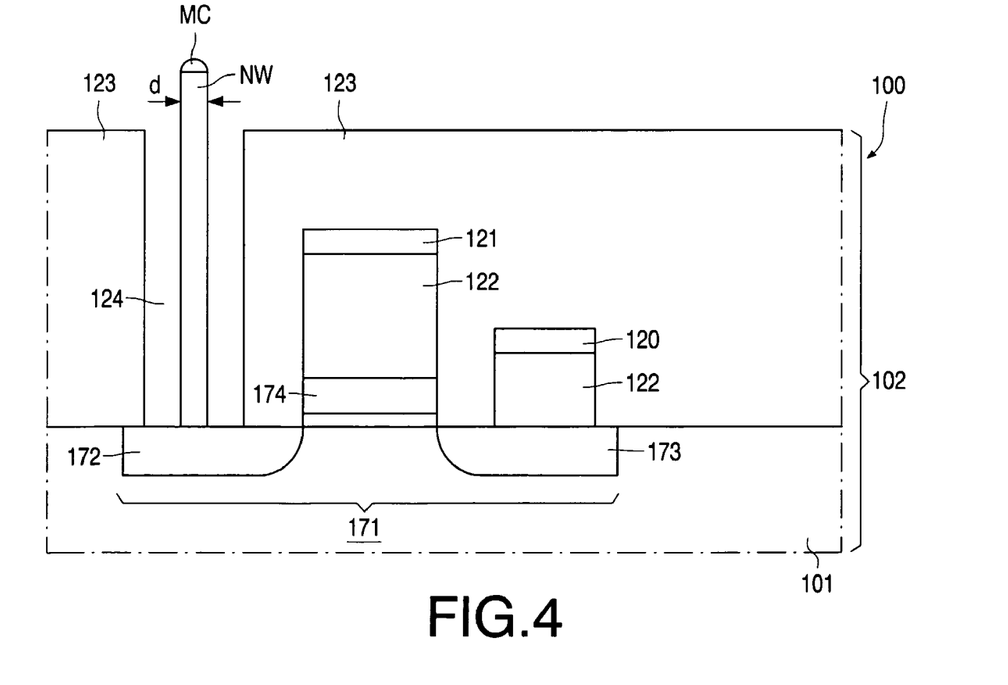
FIG. 4 is a cross section of the pre-fabricated electric device along line III-III of FIG. 2 at a second stage of the manufacturing.

The metal clusters MC are used as nucleus or catalyst for growth of the nanowires in the VLS method. The metal clusters MC are heated to a temperature range of 400-800° C. and exposed to a precursor flow which comprises the desired phase change material. The metal clusters MC act as the energetically favored sites for absorption of the gas-phase reactants, i.e. the reactants condensate at these sites from which then nanowires NW grow. The result of this step is shown in FIG. 4. The size of the metal cluster MC acting in this way as a catalyst determines the diameter of the nanowire NW growing thereof.

The nanowires NW comprises a phase change material having an electrical resistivity switchable between a first value and a second value which may be composed of $(In_{1-x}Ga_x)_y Sb_{1-y}$ with $0 \leq x \leq 1$ and $0 \leq y \leq 1$. In a class of embodiments, y≈0.5, e.g. between 0.45 and 0.55, preferably 0.5. x may be e.g. 0.2, 0.4, 0.5, 0.7. The phase change material may be doped e.g. by one or more elements X selected from Te, Se and S. The dopant may be added to the gas from which the nanowires are grown, e.g. as precursors of the type $H_2X$. Alternatively, dopants may be added in a target of which a vapor is produced by laser ablation. The doping concentration may be e.g. between 0.0001 and 1 atomic %. Nanowires of III-V materials may be grown at temperatures between 275 and 450 degree C. The temperature chosen depends on the wire diameter desired, on the pressure of the reactants and on the size of the metal particle MC.

In the VLS method the diameter d of the nanowire NW depends on the temperature of the growing nanowire and on the size of the metal clusters MC. A hollow nanowire, also referred to as nanotubes, may be used which results in a relatively small active volume of the phase change material as compared to the external wire diameter. For nanowires of $(In_{1-x}Ga_x)_y Sb_{1-y}$ with $0 \leq x \leq 1$ and $0 \leq y \leq 1$ at a temperature T below approximately 500 degree C. solid nanowires are grown, but at a temperature T higher than approximately 500 degree C. hollow nanowires are formed. The nanowire NW may comprise a part with a solid core and a part with a hollow core.

The metal film, the metal cluster MC and/or the colloidal metal particles outside the opening 124 may be removed by polishing or angle-dependent ion milling prior to the growth of the nanowires NW. This prevents that nanowires are grown outside the opening 124. At this moment the barrier layer inside the opening 124, if present, may be removed at least partly such that the level of the barrier layer is lower than top of dielectric layer 123. If the metal film and/or the colloidal metal particles outside the opening 124 are not removed prior to the growth of the nanowires NW, the nanowires NW grow also on top of the barrier layer outside the opening 124. The nanowires NW outside the opening 124 may be removed later in the process, e.g. during removal of excess deposited further dielectric 223 as explained below.

Preferably, one nanowire NW is grown in each opening 124, i.e. the nanowires NW of the set are located in different openings 124. However, more than one nanowire NW per opening 124 is possible as well. After the steps described so far, a substrate 101 having a set of prefabricated nanowires NW having different lengths is usually obtained due to process fluctuations of the VLS method.

Figure 5:
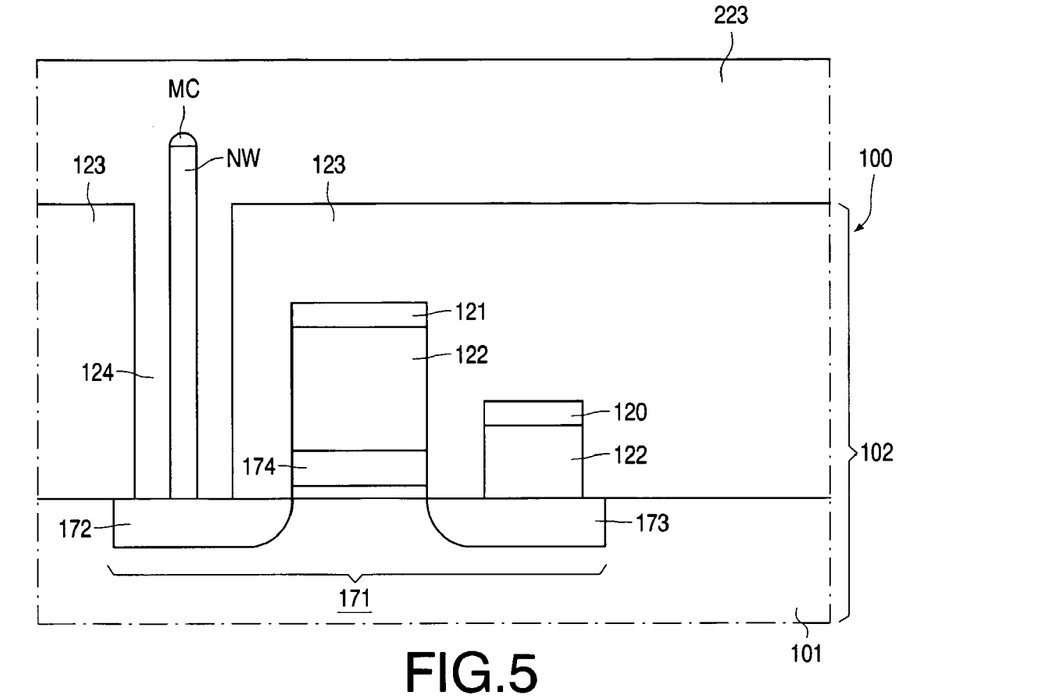
FIG. 5 is a cross section of the pre-fabricated electric device along line III-III of FIG. 2 at a third stage of the manufacturing.

After growth of the nanowires NW the remainder of the opening 124 is filled with a further dielectric 223 which may be e.g. silicon oxide, e.g. derived from TEOS. Alternatively, or in addition a high-density plasma (HDP) may be used to form silicon dioxide in the aperture. The result of this step is shown in FIG. 5. Further dielectric 223 may be composed of the same or of a different material than dielectric 123, e.g. oxide and nitride, or vice versa, such that dielectric 123 can be used as a stop layer for polishing. Further dielectric 223 may be any electrically insulating material. A thermal insulator, such as porous $SiO_2$, may be advantageous in cases where changing the resistivity of the memory material requires increased temperatures. In some cases, e.g. when the electric device comprises standard CMOS devices as well, dielectric material 123 and further dielectric material 223 may be of the same material and the material removal may be polishing which is terminated after a fixed polishing time.

After deposition of the further dielectric 223, the set of prefabricated nanowires NW is subjected to a material removal treatment for obtaining the set of nanowires NW, each of which has the same height with respect to the substrate 101. During this material removal treatment, e.g. by etching or by CMP, the further dielectric 223 outside the opening 124 is removed as well to expose the upper end of the nanowires NW. As a result of this step each of the nanowires has the same contact area exposed as is shown in FIG. 6.

Subsequently, the structure thus obtained, and in particular the exposed contact area, i.e. to the exposed an end portion of the nanowires NW, is provided with a contact electrode 108. The contact electrode 108 may be formed of a layer of e.g. TiN, W, TiW, TaSiN, TiSiN or TiAlC having a thickness of e.g. 50-200 nm. The contact electrode 108 may electrically connect the nanowire NW comprising the phase change material to a second terminal 272 to which a sensing circuit may be connected. The second terminal 272 may be integral part of the contact electrode 108. The sensing circuit may be arranged to establish an electric parameter which relates to the resistance of a conductive path from the first terminal, formed in this embodiment by source region 172, via the nanowire NW comprising the phase change material contacted thereby and the contact electrode 108 to the second terminal 272.

Figure 6:
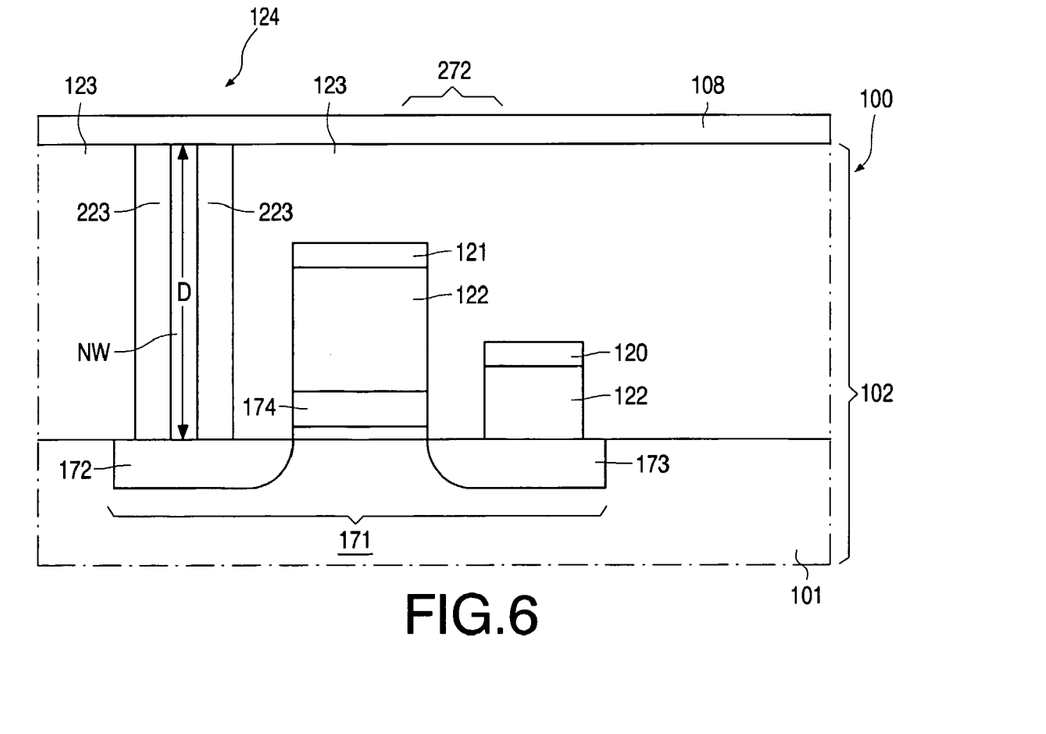
FIG. 6 is a cross section of the pre-fabricated electric device along line III-III of FIG. 2 at a fourth stage of the manufacturing.

In the electric device 100 according to the embodiment shown in FIGS. 2-6 all nanowires NW are electrically connected to the contact electrode 108 such that they have approximately the same distance D from their end point to the respective source region 172 as is shown schematically in FIG. 6.

The electric device 100 thus obtained has a body 102 with a resistor comprising a phase change material being changeable between a first phase and a second phase. The resistor has a first electrical resistance when the phase change material is in the first phase, and a second electrical resistance different from the first electrical resistance when the phase change material is in the second phase. The resistor is a nanowire NW electrically connecting a first conductor which in the embodiment of FIGS. 2-6 is constituted by the source region 172 and a second conductor which in the embodiment of FIGS. 2-6 is constituted by the contact electrode 108. The phase change material may undergo a phase transition from the first phase to the second phase, and back. The phase transition may be induced by an electric current flowing from the first conductor through the nanowire NW to the second conductor, or vice versa.

Each nanowire NW electrically contacts the contact electrode 108 in a respective contact area. In an embodiment for all nanowires NW, the respective contact areas are substantially identical as substantially identical metal particles MC have been used.

The first terminal may comprise at least two mutually insulated terminal regions, in the embodiment of FIGS. 2-6 nine source regions 172. Each of the mutually insulated terminal regions is electrically connected to the respective contact electrode 108 exclusively by a respective single nanowire NW comprising the phase change material. Alternatively, one or more of the mutually insulated terminal regions may be electrically connected to the respective contact electrode 108 by more than one nanowire NW.

In the embodiment of FIGS. 2-6 each nanowire NW extends in a longitudinal direction and has a cross section perpendicular to the longitudinal direction which is substantially constant along the longitudinal direction. Each contact area is substantially identical to the cross section of the respective nanowire.

In the embodiment of FIGS. 2-6 the electric device 100 comprises an array of mutually insulated terminal regions formed by the source regions 172. Each of the terminal regions is electrically connected to the contact electrode 108 by one or more respective nanowires NW and to a respective selection device 171 such that the resistor constituted by the nanowire NW is accessible via respective selection lines 120, 121 of the grid of selection lines.

In an alternative embodiment the pre-fabricated electric device 100 is subjected to a material removal treatment which has a different selectivity for the nanowires NW and the further dielectric 223. The difference in selectivity implies that either the nanowires NW are more effectively removed than the further dielectric 223 or that the further dielectric 223 is more effectively removed than the nanowires NW. The material removal treatment may comprise more than one material removal treatments such as a CMP step followed by an etching step.

In the former case the nanowires NW is slightly recessed with respect to the further dielectric 223. The contact electrode 108 deposited onto this structure extends into the recesses thus formed thereby contacting the respective nanowire NW only inside the recess in an contact area which is identical to the cross section of the nanowire NW. Depending on the composition of the nanowires NW different etch agents may be used such as concentrated HCl, $Br_2$/HBr which etches the nanowire more effectively than the further dielectric, e.g. SiO2.

Figure 7:
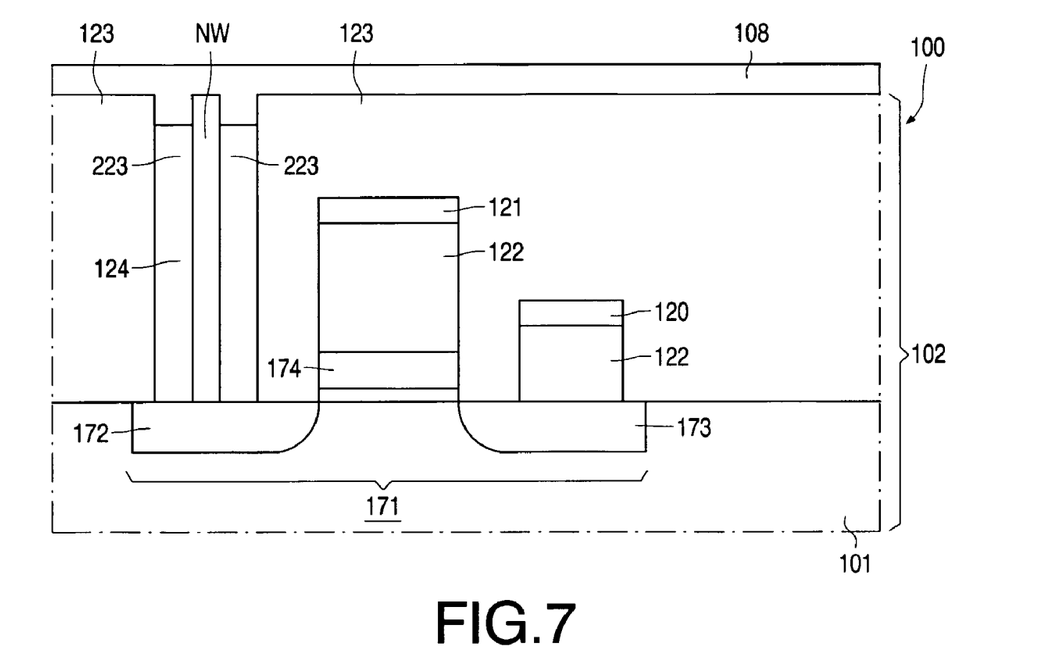
FIG. 7 is a cross section of another embodiment of the pre-fabricated electric device at the fourth stage of the manufacturing.

In the latter case the further dielectric 223 will be slightly recessed with respect to the nanowires NW and a part of the sidewall of the nanowire is exposed. The contact electrode 108 deposited onto this structure extends into the recess thus formed thereby contacting the respective nanowire NW at the exposed end of the nanowire NW and those parts of the side wall being exposed as well as is shown in FIG. 7. In this way the contacting between the contact electrode 108 and the nanowire NW may be established particularly reliably. In case the further dielectric comprises $SiO_2$, this may be achieved by etching with e.g. 0.01-10% HF which etches SiO$_2$ more effectively than the nanowire NW. Alternatively, a selective dry etch may be used.

In an embodiment, the source regions 172 of the MOSFET are connected to ground, i.e. the MOSFET have a common source. The drain regions 173 are provided with the nanowires NW instead of the tungsten plugs 122. The gate electrodes 174 are electrically connected to the respective select lines 121 analogous to the embodiment shown in FIGS. 2-6. The select lines 121 form word lines. The contact electrode 108 is patterned to form bit lines which may be used for both selecting a particular cell of the array and detecting the resistance of the memory material thus selected.

The selection device 171 may be a two terminal device such as a diode, e.g. a pn diode, a Schottkey diode, a punch through diode or a Zener diode. The array structure is comparable with a diode-ROM array. During a read operation the diodes of unselected cells may be biased in the non-conducting regime to avoid additional currents flowing towards the sense amplifiers. Without selection transistors the size of memory elements may be much smaller. Moreover, several layers of memory cells may be stacked on top of each other thus forming a 3D memory. Such a two terminal selection device may be build in the nanowires NW, e.g. by means of a pn junction between a semiconducting part of the nanowire which is p doped and a semiconducting part of the nanowire which is n doped. Such a pn junction, shown in the inset of FIG. 8, may be used for selecting one memory element and makes the selection transistors redundant.

Figure 8:
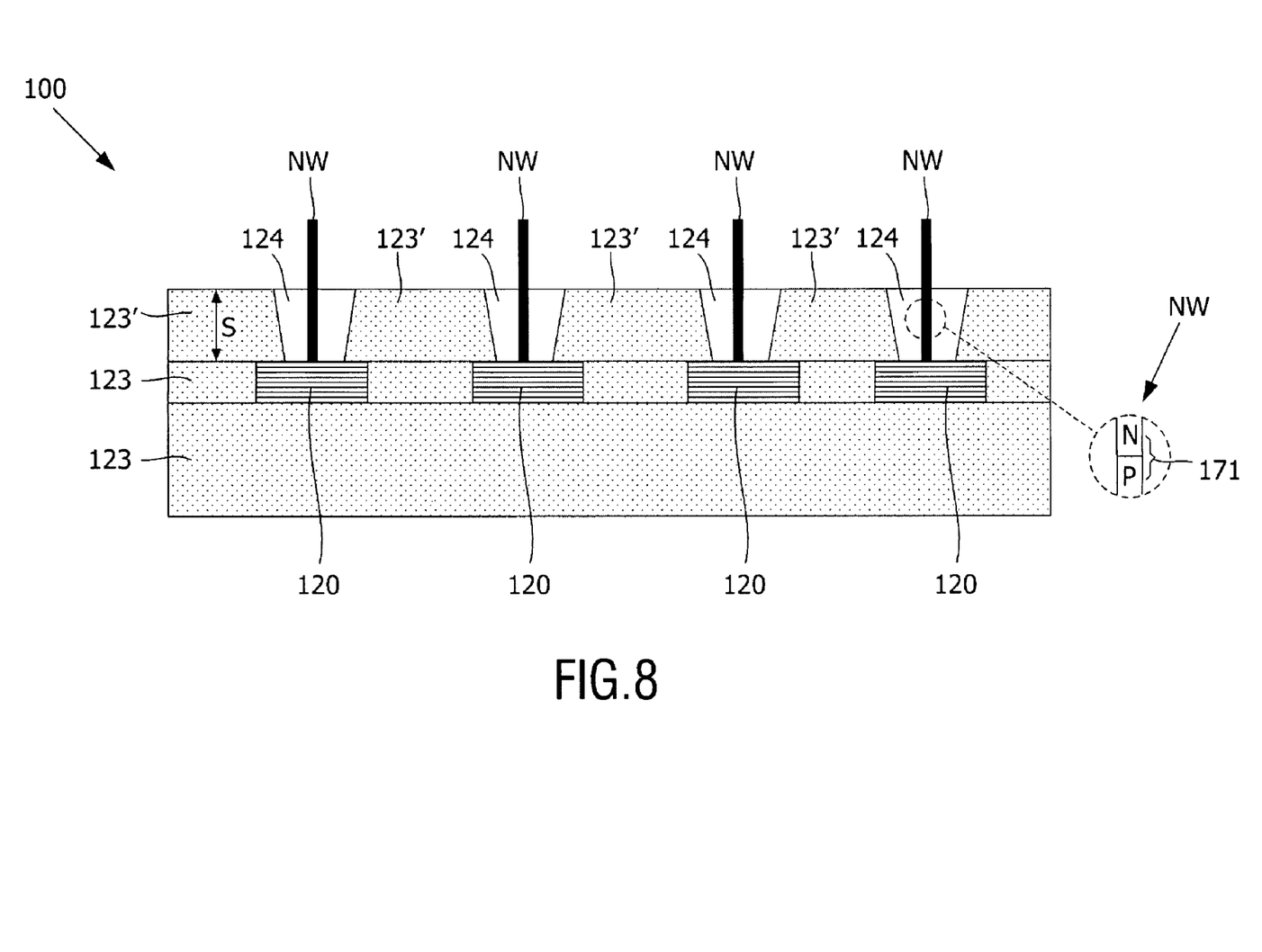
FIGS. 8-10 are cross sections of another embodiment of the pre-fabricated electric device at successive stages of the manufacturing.

The nanowire comprising the selection device may be grown directly on a part of the substrate 101 which may be doped to form the first conductor, i.e. in the so called front end. Alternatively, it may be provided in the so-called back end of an electric device 100 as is shown e.g. in FIGS. 8-10. In this latter case the nanowires may be embedded in one or more dielectric layers 123 such that they are in electric contact with a conductive layer such as an Al or Cu metal line. This layer may be a selection line 120 or 121 which may be obtained by standard IC processing. On top of the selection lines 120 a dielectric layer 123' of e.g. silicon oxide may be deposited. Dielectric layer 123' may be provided with openings 124 with which at least parts of the selection lines 120 are exposed. Inside openings 124 nanowires NW are grown by a VLS method in a way similar to that described with reference to FIGS. 3-6. First a metal cluster MC is deposited inside the opening 124, then the nanowires NW are grown in the opening 124. The result of these steps is shown in FIG. 8. Subsequently, the remainder of the opening 124 is filled by a dielectric 223. A part of the dielectric 223 and/or of the nanowires NW may be removed by a material removal treatment to expose a part of the nanowires NW.

The aperture 124 has a depth S of 15, 25, 75 nm or 200 nm in a direction parallel to a main axis of the nanowire.

Figure 9:
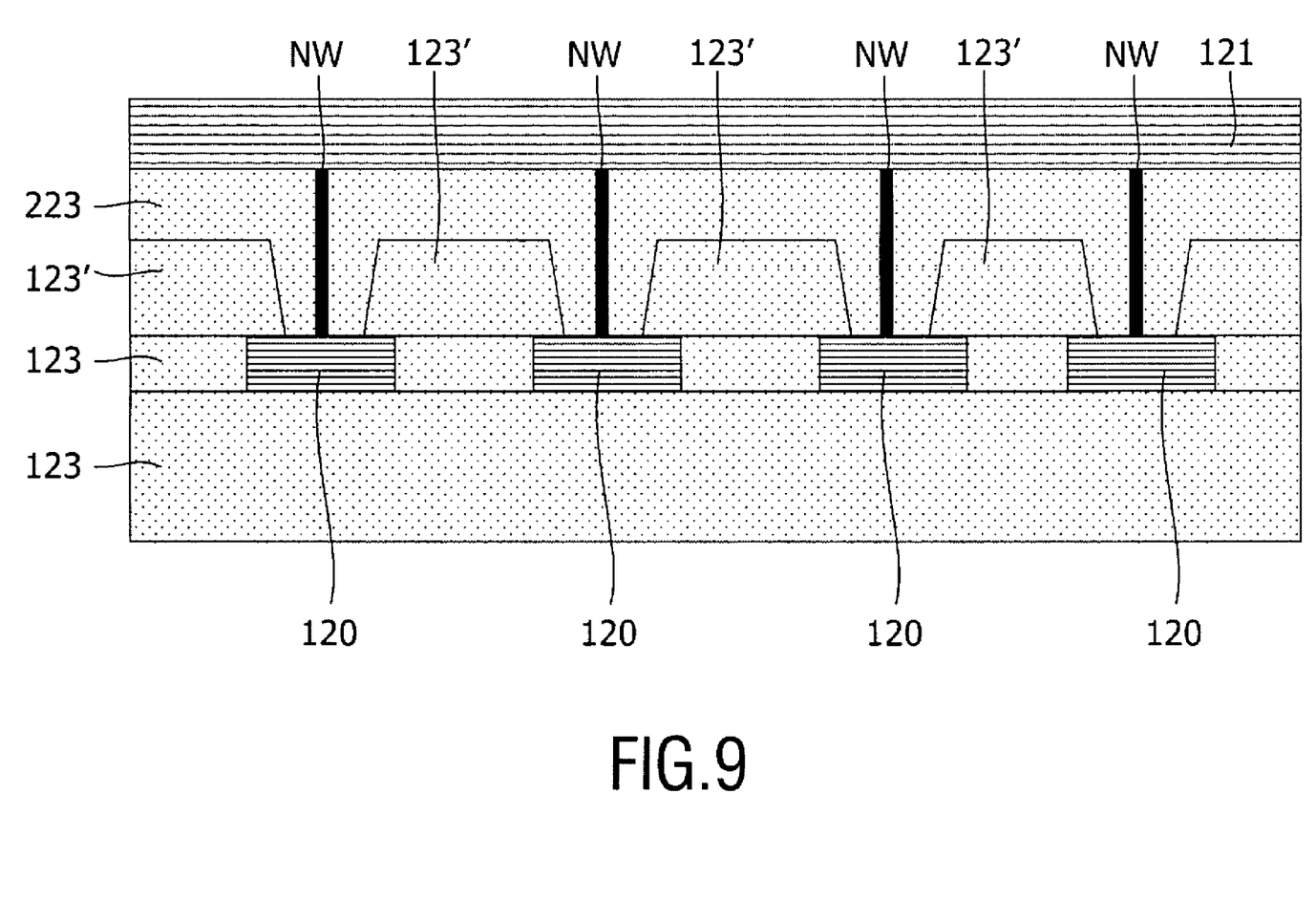

On top of the pre-fabricated device 100 shown in FIG. 8 a layer of a metallic conductor such as TiN, W, TiW, TaSiN, TiSiN, TiAlC having a thickness of 50-200 nm may be provided, on top of which a layer of Al or Cu may be provided. These layers are patterned to form selection lines 121 which may be perpendicular to selection lines 120. In FIG. 9 one selection line 120 is shown but the electric device 100 may comprise a multiplicity of, e.g. mutually parallel, of such selection lines 120 on top of the selection lines 121. This results in a quasi two-dimensional array of memory cells each comprising a nanowire NW comprising phase change material and a selection device 171. The electric device 100 may be finished with a subsequent passivation layer and optionally with one or more interconnect layers.

Alternatively, the electric device 100 may comprise of the structures shown in FIG. 9 stacked on top of each other. In such a case a three-dimensional memory array may be obtained. To this end, the selection line 121 may be provided with a dielectric layer 123" shown in FIG. 10, similar to dielectric layer 123'. Dielectric layer 123" is provided with openings 124' exposing a part of the underlying selection line 121. The openings 124' are provided with nanowires NW' analogous to nanowires NW in openings 124. The remainder of the openings 124' may be filled with a further dielectric material 223' analogous to dielectric material 223. The dielectric material 223' and optionally a part of the nanowires NW' may be removed by a material removal treatment, thereby exposing the outer ends of nanowires NW'. This pre-fabricated electric device 100 may be provided with selection lines 120' analogous to selection lines 120, resulting in the pre-fabricated electric device 100 shown in FIG. 10. Selection lines 120' may be provided with further dielectric material, not shown and the electric device may be finished in the usual way of IC production.

Selection lines 120', nanowires NW', and selection lines 121 form a second level of the three-dimensional memory array. In the embodiment shown in FIG. 10 there are two levels each having four selection lines 120. However, the invention is not limited to this number of selection lines 120, 120' or to this number of levels.

Figure 11:
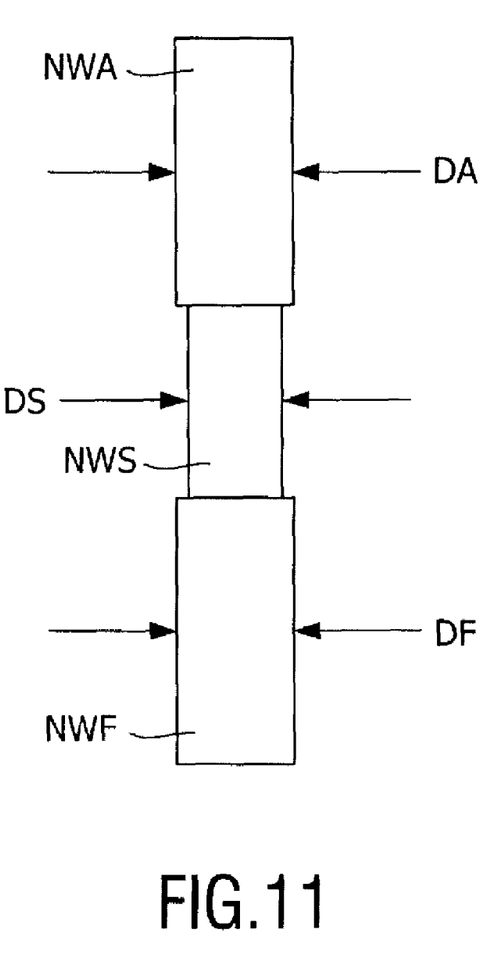
FIG. 11 is a cross-section of an embodiment of nanowires of the electric device.

In those methods according to the invention in which the nanowire is grown by means of a vapor-liquid-solid growth method, the temperature of the growing nanowire may be decreased during the growth. As the wire diameter depends on the temperature of the nanowire when being grown, i.e. the diameter is reduced at reduced temperatures, e.g. decreased by 20 or 50 degrees C., a nanowire NW may be obtained having a segment NWS with a reduced wire diameter. As the current density is higher in the segment with the reduced wire diameter the phase transition is induced in this segment. This results in a relatively reliable definition of the active volume. As shown in FIG. 11, the nanowire NW thus obtained comprises a segment NWS, which comprises the phase change material and has a wire diameter DS, and a further segment NWF with a further wire diameter DF which is larger than the wire diameter DS of the segment. Optionally, the nanowire NW may comprise an additional segment NWA with an additional wire diameter DA which is larger than the wire diameter DS of the segment, the segment NWS being located between the further segment NWF and the additional segment NWA.

The segment NWS of the nanowire comprising the phase change material may have a wire diameter between 5 and 50 nm such as 10 nm or 25 nm.

The segment NWS and the further segment NWF may each comprise the phase change material. The additional segment NWA, if present, may also comprise the phase change material.

Alternatively or in addition, the nanowire NW may comprise a further segment NWF and optionally an additional segment NWA having a different chemical composition than the segment comprising the phase change material. The chemical composition of the further segment may be optimized for having a relatively low electrical resistance ad/or a relatively low heat conductivity. The further segment NWF and optionally the additional segment NWA may have different doping concentrations. The dopants of the further segment NWF and the additional segment NWA may be the same or different species.

Figure 10:
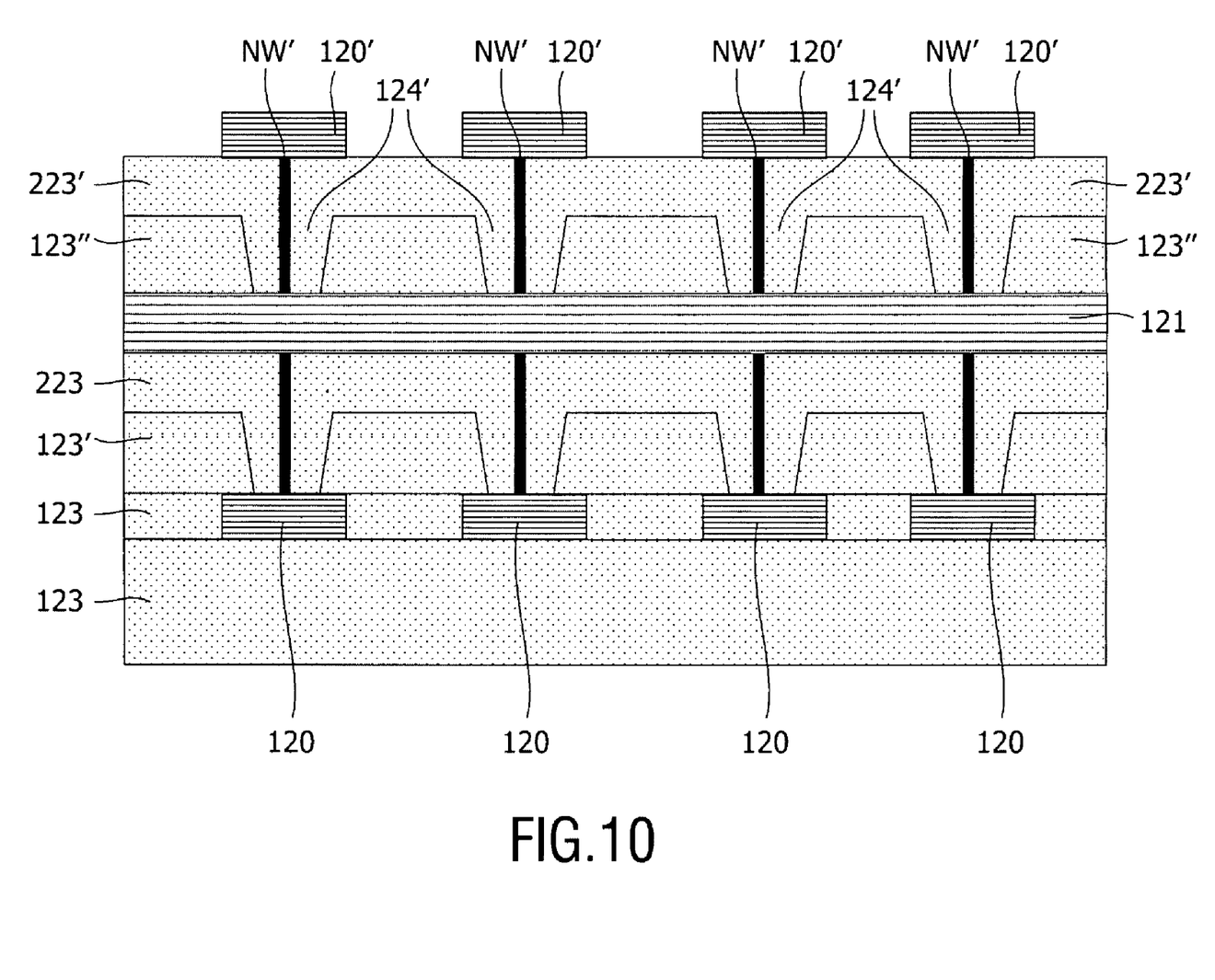

Such nanowires NW may be incorporated in the electric device 100 shown in FIG. 6 or 10.

In the VLS method segmented nanowires comprising a selection device such as a pn junction may be obtained by changing the gas composition during nanowire growth. The gas may be obtained by laser ablation of a doped target, i.e. the dopant has been added to the target before it is ablated. For obtaining n-type segments in GaSb nanowires, e.g. with a doping concentration of approximately $10^{18}$ cm$^{-3}$ 0.001-0.1 mol %, Te, Se and/or S is used, for obtaining p-type segments in GaSb nanowires, e.g. 0.1-1.0 mol %, Ge, Si and/or Zn is used. For doping by Si, SiH$_4$ may be added to the gas. Such a pn junction may be combined with a segment comprising In$_{0.5}$Ga$_{0.5}$Sb as a phase change material. Combining GaSb semiconducting nanowire segments with In$_{0.5}$Ga$_{0.5}$Sb is advantageous as both materials have a lattice mismatch of 4% which still allows for easy integration within one nanowire.

The use of pn junction is for selection purposes to prevent parallel current from neighboring devices when arranged in an array as e.g. as shown in FIG. 10. In this case the selection transistor can be omitted and cell size is reduced. The resistance of the diode is not of major importance as long as enough current is conducted through the diode.

The maximum allowable current density in the nanowire may be increased by increasing the thickness on the low-doped side of the pn junction. The highly doped side of the nanowire may be thinner and in contact with the segment comprising the phase change material. The different wire diameters of the two parts constituting the pn junction may be obtained by changing the substrate temperature during the growth of the nanowires as is described in the patent application WO 2003/083949 which is incorporated herein by reference.

In a variation of this embodiment doped nanowires NW are grown inside the openings 124, and 124' if present, which have incorporated an n-p-n junction. Such a nanowire NW may constitute a punch-through diode. Semiconducting monocrystalline nanowires of all IV, III-V, and II-VI classes can be synthesized by the VLS (vapor-liquid-solid) mechanism as described in the article "General synthesis of compound semiconductor nanowires" by X. Duan and C. M. Lieber in Advanced Materials, volume 12, pages 298-302, 2000. The wires may have lengths up to several microns and their diameter may be tuned in the range from 4 nm to a few hundred nm. The nanowires may be grown in the gas phase as well as on a solid substrate. By changing the chemical composition of the donor gas, p-n junctions can be grown inside the wires as is described in the article "Growth of nanowire superstuctures for nanoscale photonics and electronics" by M. S. Gudiksen et al., Nature, volume 415, page 617-620, 2002. Similarly, by changing the main components in the composition of the gas phase, e.g. from In and P to In and As, nanowires containing heterojunctions may be fabricated as is described in the article "One-dimensional heterostructures in semiconductor nanowhiskers" by M. T. Björk et al., Applied Physics Letters, volume 80, page 1058-1062, 2002.

The nanowire may be composed of three subsequent differently doped semiconductor regions such as n-p-n or p-n-p. Each of this region may be a doped semiconductor of the same or of a different class of materials. E.g. all three regions may be composed of one and the same III-V, II-VI or IV class material. An example of the former is InP. Alternatively, one of the regions may be of a different class of materials, e.g. a p doped II-VI class material sandwiched between two n-doped regions of a IV class material.

In this embodiment the doping profile of the nanowires may realize the punch-through diode functionality. A punch-through diode is a non-linear element comprising at least a first and a second region of a first conductivity type and a third region of a second conductivity type between the first and the second region. The first and the third region on the one hand, and the third and the second region on the other hand form two oppositely located rectifying junctions. At least one of these can be biased in a forward direction by means of the electric field of the other junction, which is reversibly biased. The width of the third region is sufficiently small and its doping profile is such that punch-through occurs between the two junctions before one of the junctions breaks down in at least one bias direction. The punch-through diode has two terminals with the same doping type. Therefore, a relatively small number of different materials may be used in various steps of the production process when electrically connecting the terminals. When the semiconductor regions constituting the punch through diode are part of a nanowire, this has the advantage that mono-crystalline semiconductor regions, even of different semiconducting materials, may be grown on top of each other, e.g. by the VLS method. In this way a relatively low resistance of the semiconducting regions is obtained while requiring a relatively low temperature of 400 to 550 degrees Celsius. This manufacturing of a high quality, low resistance selection device at relatively low temperatures allows for integration of punch through diodes in process flows such as in the backend of an IC which allow only relatively low temperatures. The advantage of a relatively low resistance and a relatively low temperature does not dependent on whether or not the punch through diode is connected to a layer of memory material.

The doping profile may be a symmetric n-p-n profile or an asymmetric n-p$^+$-p-n profile. The thickness of the p-segment may be chosen such as to achieve the desired reach-through and flat-band voltages. An alternative may be a double heterojunction with the central segment having a higher majority-carrier band minimum.

The electric device according to this aspect of the invention may have one or more of the following advantages: the nanowires may have a relatively low resistivity, in particular when the nanowires are mono-crystalline. It has been shown by M. T. Björk et al. in the above cited paper that the VLS process is able to deliver mono-crystalline nanowires with a relatively low defect density, resulting in a relatively high carrier mobility. This enables the nanowires to support a relatively high current density. By appropriate metallurgy and processing contact resistances below 20 kΩ such as between 1 and 5 kΩ may be achieved as is shown in the article "Single-electron tunneling in InP nanowires" by S. De Franceschi et al. in Applied Physics Letters, volume 83, pages 344-346, 2003. In combination with the low nanowire resistivity this enables a large on/off ratio when the nanowire is used as a selection device. Both the VLS method and the fabrication of the contacts may be performed at temperatures not exceeding 500° C., and yet deliver mono-crystalline material. This enables CMOS compatibility.

The doping profile of the nanowires may be chosen such as to realize the desired diode characteristics. This may be achieved by changing the composition of the gas vapor during the growth. The composition may be changed by illuminating, e.g. with a laser, different samples during different time periods during the growth whereby atoms of the illuminated sample are brought into the gas phase and condensating in the nanowire.

The punch-through diode may be symmetrical, and may comprise a first region of a semiconducting material of a first conductivity type, in this example p-type, between a second region of a semiconducting material of a second conductivity type, in this example n-type, and a third region of a semiconducting material of a second conductivity type, in this example n-type.

In a variation of this embodiment, the p region is composed of a relatively highly doped p+ region and of a relatively lowly doped p region. The p+ region and the p region may have a thickness of some tens of nm parallel to the longitudinal direction of the nanowire, respectively. The exact values of the thickness and the doping concentrations are determined by the desired electrical characteristics.

In summary, the method according to the invention is directed to manufacturing an electric device 100 according to the invention, having a body 102 with a resistor comprising a phase change material being changeable between a first phase and a second phase, the resistor having a first electrical resistance when the phase change material is in the first phase, and a second electrical resistance different from the first electrical resistance when the phase change material is in the second phase. The resistor is a nanowire NW electrically connecting a first conductor 172, 120 and a second conductor 108, 121. The method comprises the step of providing a body 102 having the first conductor 172, 120, providing the first conductor 172, 120 with the nanowire NW thereby electrically connecting the nanowire NW and the first conductor 172, 120, and providing the nanowire NW with the second conductor 108, 121 thereby electrically connecting the nanowire NW and the second conductor 108, 121.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method of manufacturing an electric device comprising the acts of:
   providing a body with a resistor comprising a phase change material being changeable between at least a first phase and a second phase, the resistor being a nanowire;
   providing the body with a first conductor;
   providing a dielectric over the body covering the first conductor;
   providing an opening in the dielectric to expose at least a portion of the first conductor;
   providing a metal film inside the opening;
   heating the metal film to form a metal particle inside the opening;
   growing the nanowire using the metal particle as a catalyst to provide the first conductor with the nanowire to electrically connect the nanowire to the first conductor; and
   providing the nanowire with a second conductor to electrically connect the nanowire to the second conductor.

2. The method of claim 1, wherein the act of growing the nanowire is by a vapor-liquid-solid growth method.

3. The method of claim 2, wherein the metal particle has a diameter between 2 and 100 nm.

4. The method of claim 2, wherein during the act of growing, a temperature of the growing nanowire is decreased.

5. The method of claim 1, wherein the opening has a depth of 5-100 nm, in a direction parallel to a main axis of the nanowire.

6. The method of claim 1, wherein the phase change material comprises $(In_{1-x}Ga_x)$ with $0 \leq x \leq 1$ and $0 \leq y \leq 1$.

* * * * *